United States Patent [19]
Murayama

[11] Patent Number: 6,081,038
[45] Date of Patent: Jun. 27, 2000

[54] SEMICONDUCTOR CHIP PACKAGE STRUCTURE

[75] Inventor: Kei Murayama, Nagano, Japan

[73] Assignee: Shinko Electric Industries Co., Ltd., Nagano, Japan

[21] Appl. No.: 09/285,971

[22] Filed: Apr. 5, 1999

[30] Foreign Application Priority Data

Apr. 7, 1998 [JP] Japan .................................. 10-094895

[51] Int. Cl.⁷ ........................... H01L 23/48; H01L 23/52; H01L 29/40
[52] U.S. Cl. ............................. 257/783; 257/788
[58] Field of Search .................... 257/783, 778, 257/737, 738; 438/613, 614, 615, 616; 228/180.22

[56] References Cited

U.S. PATENT DOCUMENTS

| 5,834,848 | 11/1998 | Iwasaki | 257/778 |
| 5,959,362 | 9/1999 | Yoshino | 257/778 |

FOREIGN PATENT DOCUMENTS

| 1-132138 | 5/1989 | Japan | 257/783 |
| 2-82633 | 3/1990 | Japan | 257/778 |

*Primary Examiner*—Mahshid Saadat
*Assistant Examiner*—Jhihan B. Clark
*Attorney, Agent, or Firm*—Pennie & Edmonds LLP

[57] ABSTRACT

The object of the present invention is to provide a semiconductor chip package structure in which thermal stress exerted on a wiring substrate is mitigated to improve the reliability of the bond between the semiconductor chip and the wiring substrate and the bond between the wiring substrate and the motherboard.

To achieve the above object, the present invention provides a semiconductor chip package structure in which a semiconductor chip is mounted on a wiring substrate by flip chip bonding to a wiring pattern on the wiring substrate, comprising: a large number of electrode terminals disposed on an electrode arrangement surface of the semiconductor chip; a first group of the electrode terminals electrically connected to the wiring pattern by an adhesive layer; and a second group of the electrode terminals electrically connected to the wiring pattern by an elastomer layer.

10 Claims, 5 Drawing Sheets

(a)

(b)

SEMICONDUCTOR CHIP PACKAGE STRUCTURE

BACKGROUND OF THE INVENTION

1. Field of the Invention

The present invention relates to a semiconductor chip package structure in which a semiconductor chip is mounted on a wiring substrate by flip chip bonding to a wiring pattern on the wiring substrate.

2. Description of the Related Art

Recent progress of miniaturization and density of semiconductor devices is leading to dense packages by using a semiconductor chip package structure in which a semiconductor chip is mounted on a wiring substrate by flip chip bonding to a wiring pattern on the wiring substrate, such as that presented by a BGA (ball grid array) type semiconductor device. Generally, a wiring substrate has one surface with a semiconductor chip mounted thereon by flip chip bonding to a wiring pattern formed on that surface, and has the other surface with external connector terminals formed thereon and electrically connected to the wiring pattern.

FIG. 1 shows a conventional BGA type semiconductor device.

A semiconductor device 11 is basically composed of a semiconductor chip 12, solder bumps 13 as a electrode terminal of the semiconductor chip, a wiring substrate 14, an underfiller 19, and solder balls 17 as an external connector terminal of the wiring substrate 14. The semiconductor device 11 is mounted on a motherboard 18 by bonding the solder balls 17 to the motherboard 18 to complete a package structure.

The semiconductor chip 12 is mounted on one surface 14a of the wiring substrate 14. The solder bumps 13 are formed as an electrode terminal on a surface 12a of the semiconductor chip 12 and are electrically connected to wiring patterns 14c on the surface 14a of the wiring substrate 14. The solder bumps 13 are formed, for example, by forming a mask on the surface 12a of the semiconductor chip 12, followed by solder plating. This provides a large number of electrode terminals 13 in the form of solder bumps on the surface 12a.

The semiconductor chip 12 is placed on the surface 14a of the wiring substrate 14 and the solder bumps 13 are bonded to the wiring patterns 14c to leave a space between the surface 12a of the semiconductor chip 12 and the surface 14a of the wiring substrate 14 in the regions other than the bonded regions. The underfiller 19 is formed by filling the space with an insulating epoxy resin, for example.

Pads (not shown) are formed on the other surface 14b of the wiring substrate 14 and are electrically connected to the wiring patterns 14c on the opposite surface 14a through a plated portion of throughholes (not shown) extending through the wiring substrate. The pads have the solder balls 17 formed thereon as an external connector terminal.

The semiconductor device 11 is placed on the motherboard 18 with the solder balls 17 of the semiconductor device 11 being in contact with the lands 18a of the motherboard 18 to mount the semiconductor device 11 on the motherboard 18, thereby completing the package structure shown in FIG. 1.

Generally, the wiring substrate 14 and the motherboard 18 are made of an organic material (resin) of the same or a similar kind and have the same or a similar heat expansion coefficient. The wiring substrate 14, on which the semiconductor chip 12 is directly mounted, is suitably and frequently an organic material substrate such as a flexible substrate of a double sided copper clad laminate substrate. These organic materials generally have a relatively low stiffness.

In comparison with these organic materials, the semiconductor chip 12 mounted on the wiring substrate by being fixed with an underfiller has a very high stiffness and, on the other hand, a low thermal expansion coefficient.

Therefore, when the heating is effected for mounting the semiconductor device 11 on the motherboard 18, the wiring substrate 14 is prevented from free displacement by the semiconductor chip 12 having a far greater stiffness and exhibits a thermal expansion as small as that of the semiconductor chip 12 to cause an apparent difference in thermal expansion with respect to the motherboard 18 exhibiting a relatively great thermal expansion which is a characteristic of an organic material. This generates a stress concentrated at the bonds of the solder balls 17 to lower the reliability of the bond between the solder balls 17 of the wiring substrate 14 and the pads 18a of the motherboard 18. The thus-generated thermal stress cannot be mitigated by the underfiller 19 formed of an insulating resin filled and cured in between the wiring substrate 14 and the semiconductor chip 12.

Moreover, a thermal expansion difference between the semiconductor chip 12 and the wiring substrate 14 lowers the reliability of the bond between the solder bumps 13 as an external terminal of the semiconductor chip 12 and the wiring patterns 14c on the wiring substrate 14.

These phenomena become more significance as the semiconductor chip 12 becomes denser and the wiring substrate 14 is enlarged.

Forming of the solder bumps 14 on the electrode terminal arrangement surface 12a of the semiconductor chip 12 requires complicated process steps including forming an UBM (under bump metal) on the surface 12a and plating of the surface 12a, which unavoidably raises the production cost.

SUMMARY OF THE INVENTION

The object of the present invention is to provide a semiconductor chip package structure which can be economically produced and in which thermal stress exerted on a wiring substrate is mitigated to improve the reliability of the bond between the semiconductor chip and the wiring substrate and the bond between the wiring substrate and the motherboard.

To achieve the above object, the present invention provides a semiconductor chip package structure as follows.

(1) A semiconductor chip package structure in which a semiconductor chip is mounted on a wiring substrate by flip chip bonding to a wiring pattern on the wiring substrate, comprising:
   a large number of electrode terminals disposed on an electrode arrangement surface of the semiconductor chip;
   a first group of the electrode terminals electrically connected to the wiring pattern by an adhesive layer; and
   a second group of the electrode terminals electrically connected to the wiring pattern by an elastomer layer.

(2) A semiconductor chip package structure according to item (1), wherein the electrode arrangement surface of the semiconductor chip consists of a peripheral area and a core area surrounded by the peripheral area, the electrode terminals of the first group being disposed in the peripheral area and the electrode terminals of the second group being disposed in the core area.

(3) A semiconductor chip package structure according to item (1), wherein the electrode arrangement surface of the semiconductor chip consists of a peripheral area and a core area surrounded by the peripheral area, the electrode terminals of the first group being disposed in the core area and the electrode terminals of the second group being disposed in the peripheral area.

(4) A semiconductor chip package structure according to item (1), wherein the electrode arrangement surface of the semiconductor chip consists of a pair of opposite side zones and a center zone intervening between the side zones, the electrode terminals of the first group being disposed in the side zones and the electrode terminals of the second group being disposed in the center zone.

(5) A semiconductor chip package structure according to item (1), wherein the electrode arrangement surface of the semiconductor chip consists of a pair of opposite side zones and a center zone intervening between the side zones, the electrode terminals of the second group being disposed in the side zones and the electrode terminals of the first group being disposed in the center zone.

(6) A semiconductor chip package structure according to item (1), wherein the adhesive layer is formed by application of an anisotropic conductive adhesive or an isotropic conductive resin sheet.

(7) A semiconductor chip package structure according to item (1), wherein the adhesive layer consists of an insulating resin.

(8) A semiconductor chip package structure according to item (1), wherein the elastomer layer consists of an adhesive insulating resin.

(9) A semiconductor chip package structure according to item (1), wherein the elastomer layer is formed by application of an adhesive anisotropic conductive resin or an anisotropic conductive resin sheet.

(10) A semiconductor chip package structure according to any one of items (1) to (9), wherein the semiconductor chip is mounted on one surface the wiring substrate by being flip chip bonded to the wiring pattern formed on the one surface and external connector terminals are formed on the other surface of the wiring substrate and electrically connected to the wiring pattern.

DESCRIPTION OF THE PREFERRED EMBODIMENTS

Preferred embodiments of the present invention will be described with reference to the attached drawings.

Figure 1:
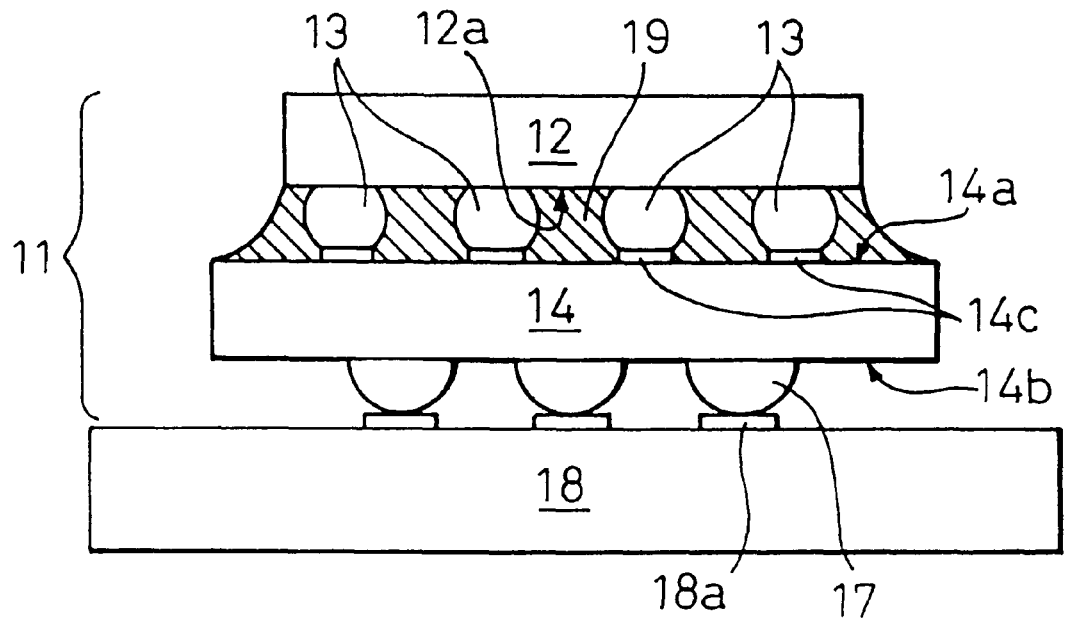
FIG. 1 is a sectional view showing a conventional semiconductor chip package structure.
Figure 2:
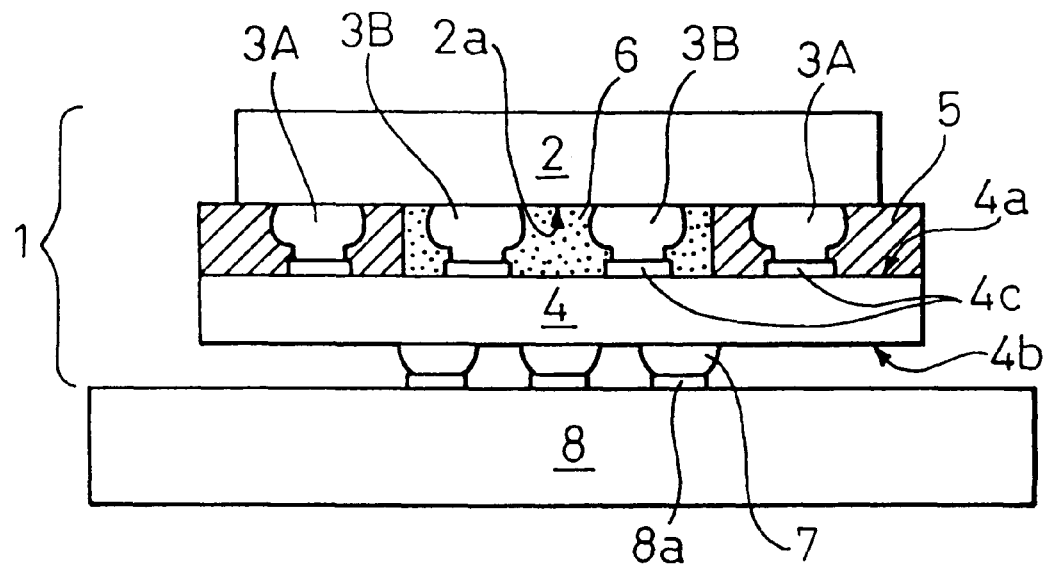
FIG. 2 is a sectional view showing a semiconductor chip package structure according to the present invention.

FIG. 2 shows a semiconductor chip package structure according to the present invention, in which a semiconductor device composed of a semiconductor chip mounted on the wiring substrate is mounted on a motherboard.

In FIG. 2, a BGA type semiconductor device 1 according to the present invention basically consists of a semiconductor chip 2, stud bumps 3A, 3B as electrode terminals of the semiconductor chip 2, a wiring substrate 4 for mounting thereon the semiconductor chip 2, an adhesive layer 5, an elastomer layer 6 and solder balls 7 as external terminals of the wiring substrate 4. The semiconductor device 1 is mounted on a motherboard 8 to complete the package structure shown in FIG. 2. In this example, among many chip size packages, the package structure for a BGA type semiconductor device will be described, but the present invention is not necessarily limited to this example.

A number of gold stud bumps 3A, 3B as an electrode terminal are disposed on an electrode terminal arrangement surface 2a of the semiconductor chip 2.

Figure 3:
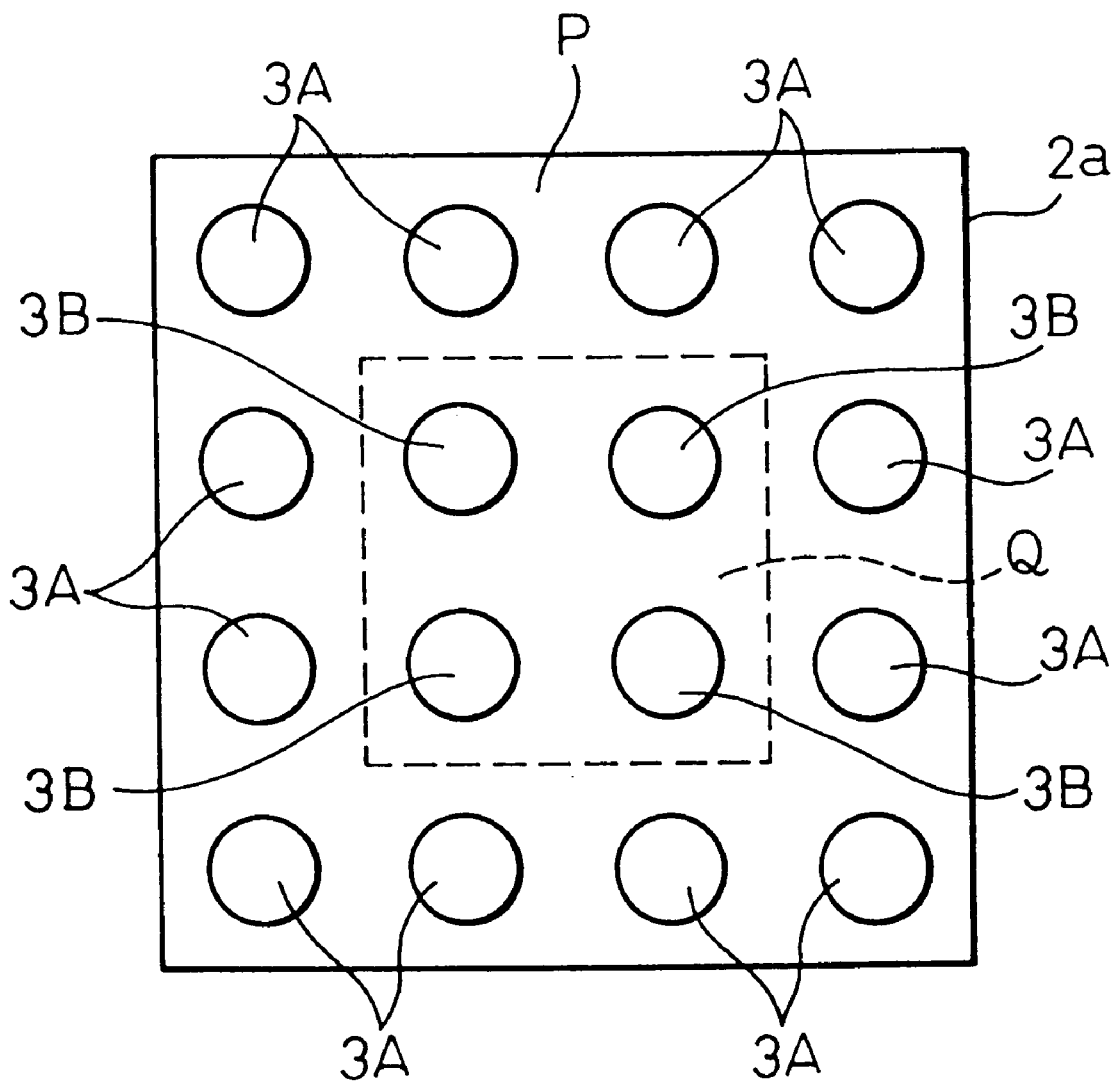
FIG. 3 is a plan view showing an electrode arrangement surface of a semiconductor chip, on which surface a large number of electrodes are divided in two groups according to the present invention.

As can be seen from FIG. 3 showing a plan view of the electrode terminal arrangement surface 2a (electrode terminals are not shown), the electrode terminal arrangement surface 2a of the semiconductor chip 2 consists of a peripheral area P in which the electrode terminals of the first group 3A are disposed and a core area Q which is surrounded by the peripheral area P and in which the electrode terminals of the second group 3B are disposed. It should be noted that, although FIG. 3 only shows a small number of electrode terminals, the areas P and Q may actually contain a large number of electrode terminals forming a large number of arrays, for example.

Figure 4:
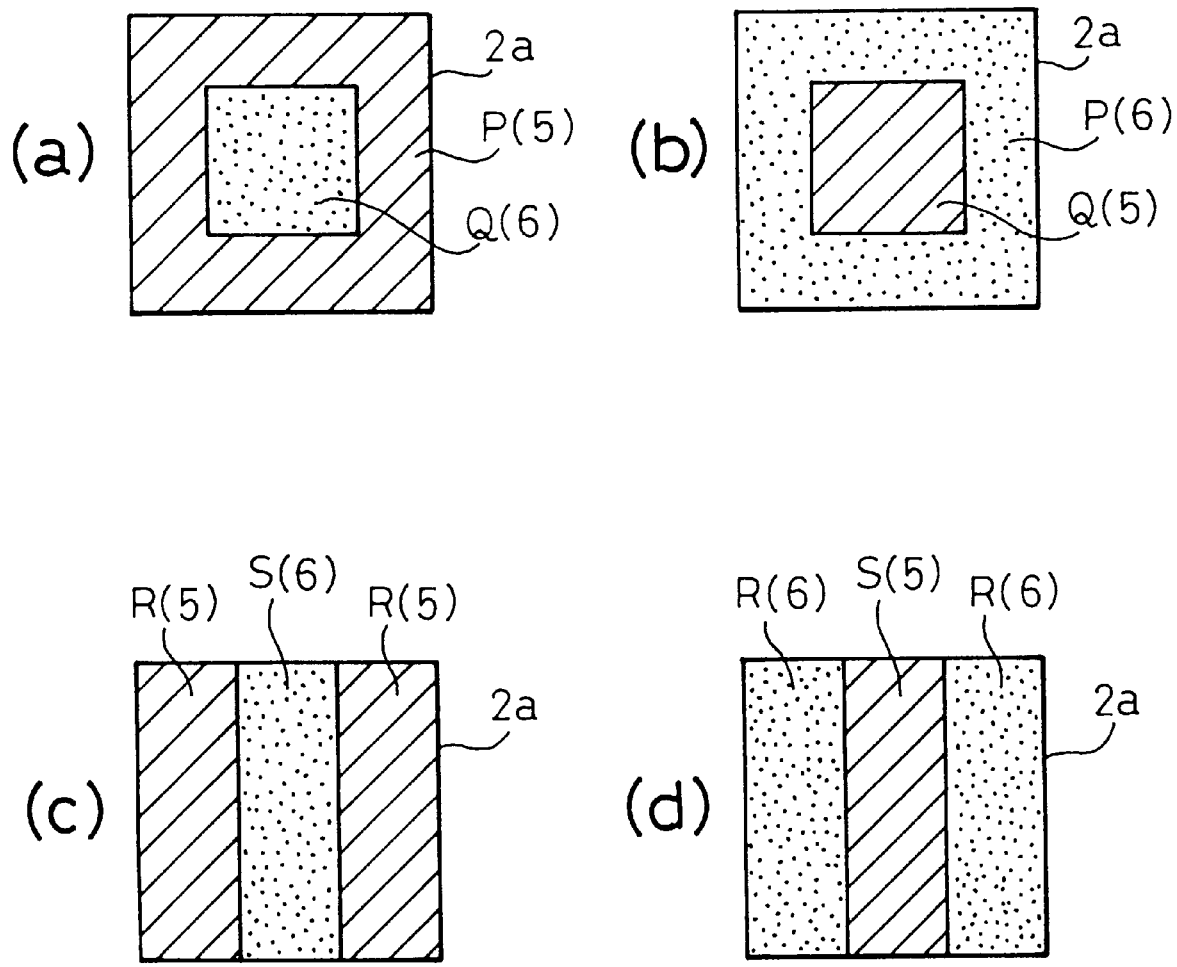
FIGS. 4(a) to 4(d) are plan views showing an electrode arrangement surface of a semiconductor chip, which surface is divided into two areas for bonding by an adhesive layer and for bonding by an elastomer layer, respectively, in different manners.

As shown in FIG. 4(a), the electrode terminals of the first group 3A disposed in the peripheral area P are electrically connected to the wiring pattern 4c by the adhesive layer 5 (denoted by "P(5)") and the electrodes of the second group 3B disposed in the core area Q are electrically connected to the wiring pattern 4c by the elastomer layer 6 (denoted by "Q(6)").

The adhesive layer 5 is formed in the area of the surface 4a of the wiring substrate 4, which area faces the peripheral area P of the semiconductor chip 2. The stud bumps of the first group 3A in the peripheral area P penetrate the adhesive layer 5 and are bonded and electrically connected to the wiring patterns 4c of the wiring substrate 4. The adhesive layer 5 typically consists of epoxy resin which may be one conventionally used as an underfiller material or may be used in the form of an anisotropic conductive resin sheet. The anisotropic conductive sheet contains metal or other conductive particles mixed in a resin adhesive, and when heated and pressed, is cured and shrunk to press the gold stud bumps 3 against the wiring patterns 4c via the metal particles, thereby facilitating electrical contact between the gold stud bumps 3 and the wiring patterns 4c.

The stud bumps of the second group 3B in the core area Q also penetrate the elastomer layer 6 and are bonded and electrically connected to the wiring pattens 4c of the wiring substrate 4. The elastomer layer 6 suitably has an elastic modulus of 100 MPa or less at room temperature, and more specifically, may consist of silicone resin or other resilient adhesive insulating resins or an anisotropic conductive resin containing nickel or other metal particles dispersed in silicone resin.

The elastomer layer 6 is formed on one surface 4a of the wiring substrate 4 by printing or application, or by adhesion of an elastomer sheet. Pads, not shown, are formed on the other surface 4b of the wiring substrate 4 and solder balls 7 as external terminals are formed on the pads.

With the elastomer layer 6 being heated so as to be semi-cured and have adhesivity, the semiconductor chip is placed on the wiring substrate 4, and heating is further carried out while pressing the upper surface of the semiconductor chip 2 and the lower surface 4b of the wiring substrate 4 to cause gold stud bumps 3A and 3B of the semiconductor chip 2 penetrate the adhesive layer 5 and the elastomer layer 6, respectively, while allowing the semi-cured elastomer layer 6 to be cured and shrunk and at the same time, allowing the adhesive layer 5 to be cured and shrunk. Thus the gold stud bumps 3A and 3B of the semiconductor chip 2 and the wiring patterns 4c of the wiring substrate 4 are mechanically engaged and electrically connected. Preferably, the elastomer layer 6 consists of an anisotropoic conductive resin containing metal particles dispersed in silicone resin and/or the adhesive layer 5 consists of an anisotropic conductive resin sheet to improve electrical conductivity of the elastomer layer 6 and/or the adhesive layer 5 in the direction of the pressing, thereby facilitating electrical connection between the gold stud bumps 3A and 3B and the wiring patterns 4c.

The wiring substrate 4 may be a conventional insulating resin substrate such as FR-4, BT, or polyimide substrates. The BT substrate may be in the form of a double sided copper clad laminate having both surfaces on which a copper foil is bonded and wiring patterns are formed. The polyimide substrate may be in the form of a flexible substrate composed of a polyimide film having a copper foil bonded thereto. Throughholes penetrate the wiring substrate 4 in its thickness direction and have a plated inner wall for electrically connecting the wiring patterns 4c formed on one surface 4c of the wiring substrate 4, on which surface the semiconductor chip 2 is mounted, and the external connector terminals or the solder balls 7 formed on the other surface of the wiring substrate 4.

The gold stud bumps 3A and 3B are formed by wire bonding to the surface 2a by using a gold wire and then cutting the bonded wire at a predetermined position, as will be specifically described later.

The thus-produced semiconductor device 1 is placed on the motherboard 8 and is then heated to bond the solder balls 7 to the lands 8a of the motherboard 8, thereby mounting the semiconductor device 1 on the motherboard 8.

In the semiconductor chip package structure according to the present invention, the elastomer layer 6 intervening the semiconductor chip 2 and the wiring substrate 4 mitigates the thermal stress acting between the semiconductor device 1 and the motherboard 8 because of the thermal expansion difference therebetween during mounting of the former on the latter, thereby improving the reliability of the bond between the solder balls 7 of the wiring substrate 4 and the lands 8a of the motherboard 8.

Moreover, the elastomer layer 6 also mitigates the thermal stress acting between the gold stud bumps 3A and 3B and the wiring patterns 4c because of the thermal stress difference between the semiconductor chip 2 and the wiring substrate 4, thereby improving the reliability of the electrical connection between the bumps and the wiring patterns.

Preferably, the adhesive layer 5 consists of an anisotropic conductive resin sheet to enable the adhesive layer 5 to be formed simply by applying a tape form anisotropic conductive resin sheet to the wiring substrate 4, thereby significantly improving the production efficiency.

Referring to FIGS. 5(a) to 5(f), the process of producing the package structure shown in FIG. 2 will be described.

Figure 5:
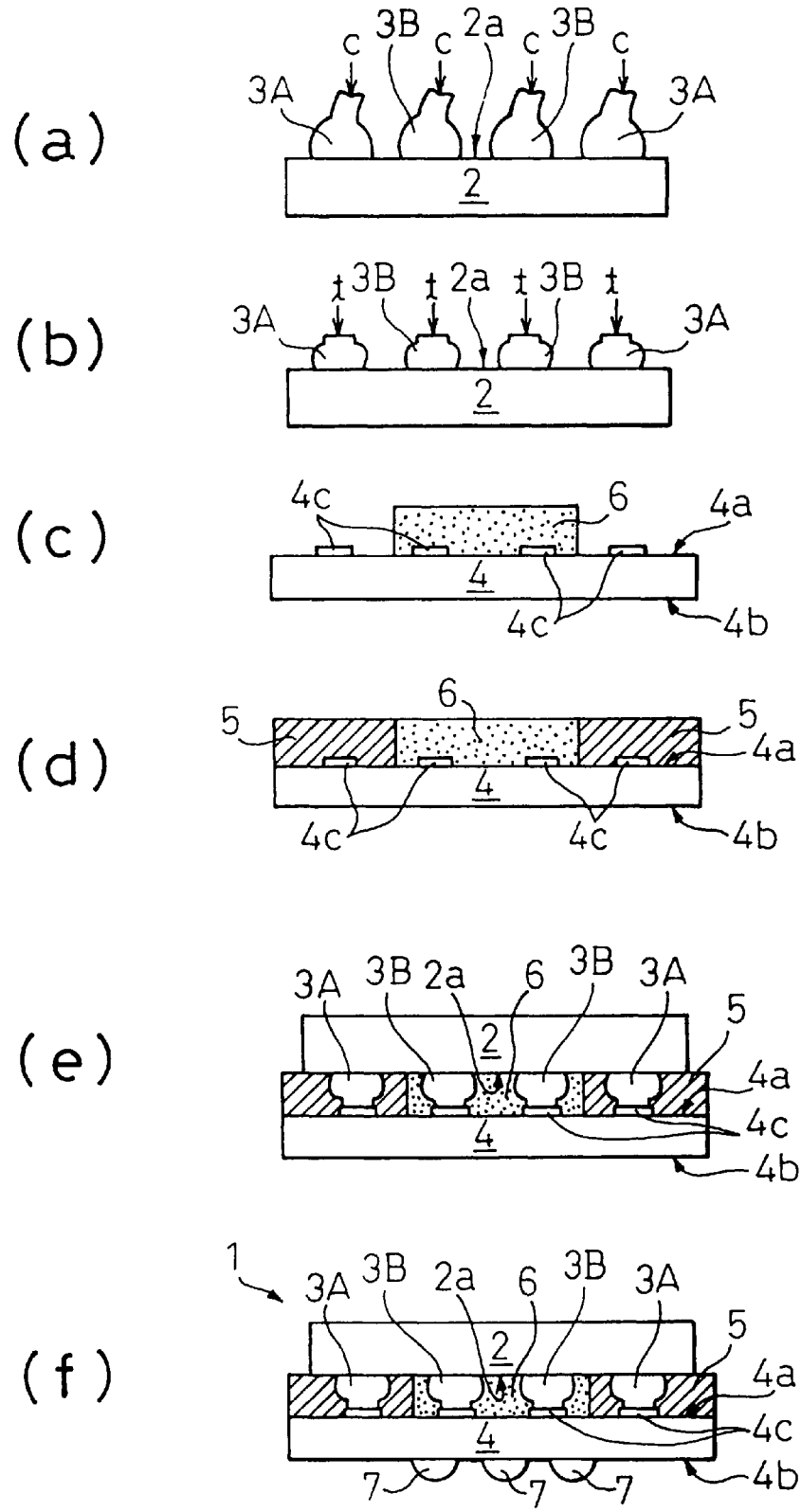
FIGS. 5(a) to 5(f) are sectional views showing a series of process steps for producing the package structure shown in FIG. 2.

As shown in FIG. 5(a), in the first step, wire bonding of a gold wire and tensile breaking of the bonded wire are carried out to form gold bumps 3A and 3B in the peripheral area P and the core area Q of the electrode terminal arrangement surface 2a of the semiconductor chip 2 (FIG. 3).

In the next step, the broken surface c of the gold bumps 3A and 3B is worked by a leveller to form a flat top surface t with substantially the same height as shown in FIG. 5(b).

In a separate step, referring to FIG. 5(c), the elastomer layer 6 is formed by printing or application and cured to a semi-cured state in a core area of one surface 4a of the wiring substrate 4 having the wiring patterns 4c formed thereon, in which the core area will face the core area Q of the semiconductor chip 2 when it is mounted on the wiring substrate 4.

In the next step, referring to FIG. 5(d), the adhesive layer 5 is formed by bonding a tape form anisotropic conductive resin sheet, for example, in a peripheral area surrounding the core area of the surface 4a of the wiring area 4, in which the peripheral area will face the peripheral area Q of the semiconductor chip 2 when it is mounted on the wiring substrate 4.

In the next step, referring to FIG. 5(e), the semiconductor chip 2 shown in FIG. 5(b) is bonded to the wiring substrate 4 shown in FIG. 5(d). Specifically, the semiconductor chip 2 having the gold stud bumps 3A and 3B formed thereon is placed over the adhesive layer 5 and the elastomer layer 6, with the chip 2 being turned over with respect to its position shown in FIG. 5(b) so that the surface 2a of the chip 2 faces the surface 4a of the wiring substrate 4. This causes the electrode terminals 3A in the peripheral area P of the semiconductor chip 2 and the electrode terminals 3B in the core area Q of the semiconductor chip 2 to penetrate the adhesive layer 5 and the elastomer layer 6 on the wiring substrate 4, respectively. The thus-formed assembly is then heated and pressed so that the adhesive layer 5 and the elastomer layer 6 are cured and shrunk and the gold stud bumps 3A and 3B of the semiconductor chip 2 and the wiring patterns 4c of the wiring substrate 4 are pressed together and electrically connected.

Preferably, the adhesive layer 5 of the peripheral area consists of an anisotropic conductive resin sheet and/or the elastomer layer 6 of the core area consists of an anisotropic conductive resin so that the above-mentioned pressing causes metal particles to be connected along the direction of the pressing in the anisotropic conductive resin sheet and/or the anisotropic conductive resin to facilitate electrical connection of the gold stud bumps 3A and/or 3B in the peripheral area and/or the core area to the wiring patterns 4c.

Because the elastomer layer 6 of the core area maintains resiliency even in the cured state, it effectively mitigates the thermal stress generated by the apparent thermal expansion difference between the wiring substrate 4 and the motherboard 8. The adhesive layer 5 consisting of an anisotropic conductive resin sheet would also contribute to mitigation of thermal stress, although the anisotropic conductive resin sheet has a resiliency relatively smaller than that of the elastomer layer 6.

In the next step, referring to FIG. 5(f), on the pads (not shown) formed on the other surface 4b of the wiring substrate 4, the solder balls 7 as external connector terminals are placed and heated to complete the semiconductor device 1. The wiring substrate 4 has throughholes extending through the thickness thereof and having a plated layer on the inner wall thereof to provide electrical connection between the solder balls 7 on the surface 4b and the wiring patterns 4c on the surface 4a and the wiring patterns 4c are further electrically connected to the semiconductor chip 2 via the gold stud bumps 3A and 3B.

In the final step, the semiconductor device 1 shown in FIG. 5(f) is placed on the motherboard 8 as shown in FIG. 2 and is then heated to bond the solder balls 7 to the lands 8a of the motherboard 8, thereby completing the package structure having the semiconductor chip 2 mounted on the motherboard 8.

During mounting the semiconductor device 1 on the motherboard 8, the thermal stress, which is generated by the apparent thermal expansion difference between the wiring substrate 4 and the motherboard 8 and acts on the wiring substrate 4, is mitigated by the resiliency of the elastomer layer 6 bonding the semiconductor chip 2 and the wiring substrate 4, so that stress concentration to the bond of the solder balls 7 is mitigated to provide an improved reliability of the bond between the solder balls 7 of the wiring substrate 4 and the lands 8a of the motherboard 8. This is particularly advantageous for an enlarged wiring substrate 4 corresponding to the density of the semiconductor chip 2.

Figure 6:
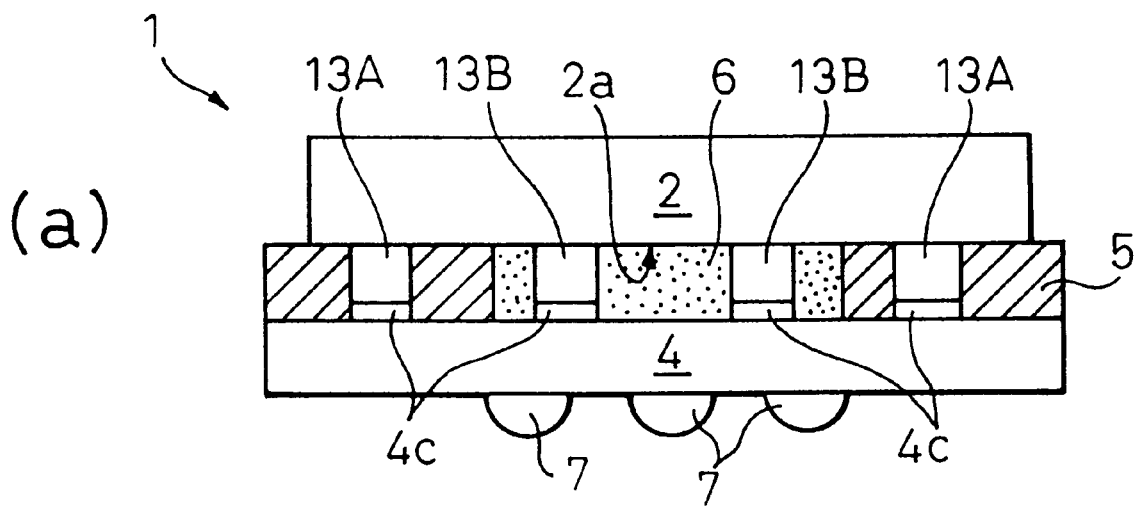
FIGS. 6(a) and 6(b) are sectional views showing electrode terminals not using stud bumps.
Figure 6:
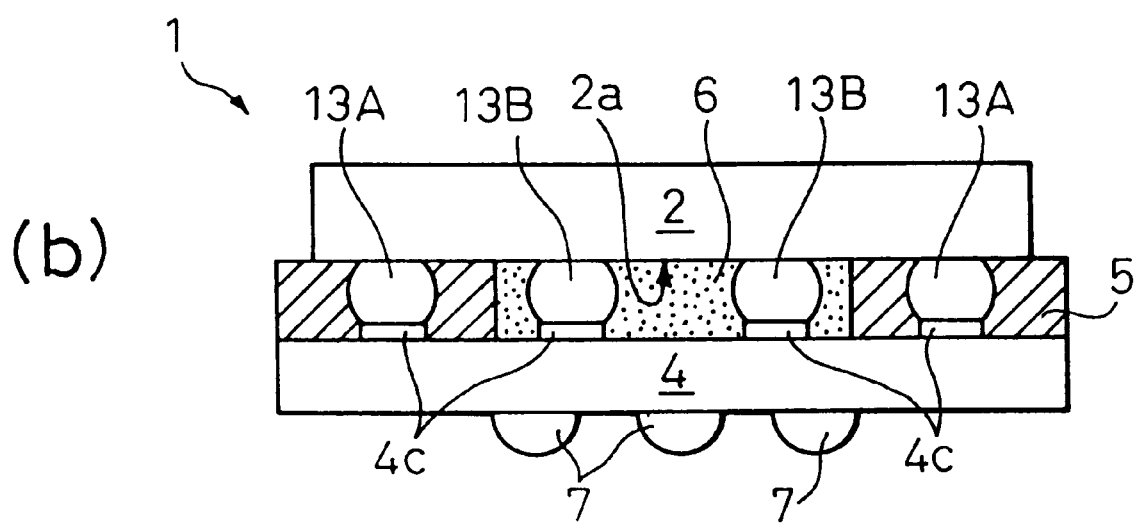

The stud bumps 3A and 3B are formed by wire bonding and advantageously simplify the process steps and thereby reduce the production cost in comparison with the plated bumps requiring the UBM step and the plating step. However, the present invention is not necessarily limited to stud bumps but may be applied either to columnar plated bumps formed by gold plating, solder plating, etc., as shown in FIG. 6(a) or to solder bumps formed by bonding solder balls as shown in FIG. 6(b).

An area bonded by the adhesive layer 5 and an area bonded by the elastomer layer 6 are not necessarily a peripheral area P(5) and a core area Q(6), respectively, as shown in FIG. 4(a), but may conversely be a core area Q(5) and a peripheral area P(6), respectively, as shown in FIG. 4(b). Alternatively, as shown in FIG. 4(c), an area bonded by the adhesive layer 5 may be a pair of opposite side zones R(5) and an area bonded by the elastomer layer 6 may be a center zone S(6) intervening the side zones R(5). Conversely, as shown in FIG. 4(d), an area bonded by the elastomer layer 6 may be a pair of opposite side zones R(6) and an area bonded by the adhesive layer 5 may be a center zone S(5) intervening the side zones R(6). Other various forms of the bonded area may be possible and may be suitably selected in accordance with the types of semiconductor chips.

This example relates to a process sequence in which the semiconductor chip 2 is mounted after both the adhesive layer 5 and the elastomer layer 6 are formed on the wiring substrate 4, but other process sequences may be used. In a modified process sequence, one of the adhesive layer 5 or the elastomer layer 6 alone is formed in the inner area such as the core area or the center zone, the semiconductor chip 2 is mounted, and in the outer area such as the peripheral area or the side zones, the other layer is then filled in the space between the semiconductor chip 2 and the wiring substrate 4 by a dispenser or the like to seal the space.

For example, the elastomer layer 6 is formed in the core area Q of the wiring substrate 4 and the semiconductor chip 2 is then placed on the layer 6 to cause the electrode terminals 3B of the core area Q of the semiconductor chip 2 penetrate the elastomer layer 6 on the wiring substrate 4. Thereafter, the adhesive layer 5 of epoxy resin, etc., is filled in the space around the elastomer layer 6 to seal the space. The resin is then cured and shrunk to cause the electrode terminals 3A of the peripheral area and the electrode terminals 3B of the core area to be pressed against, and electrically connected to, the wiring patterns 4c of the wiring substrate 4.

The semiconductor device is not necessarily limited to the structure described in this example but may have a structure in which a light curable resin seals the space around the gold bump 3 connected to the wiring pattern 4c of the wiring substrate 4.

As herein described, a semiconductor chip and a wiring substrate are bonded together via intervening elastomer layer and adhesive layer to mitigate the thermal stress generated by the thermal stress expansion difference therebetween during mounting the semiconductor device on a motherboard and to mitigate stress concentration to the bond of solder balls, thereby providing an improved reliability of the bond between the semiconductor device and the motherboard. This is particularly advantageous for an enlarged wiring substrate with a densified semiconductor chip.

Moreover, the elastomer layer also mitigates the thermal stress generated between the electrode terminals of the semiconductor chip and the wiring patterns of the wiring substrate due to the thermal expansion difference between the semiconductor chip and the wiring substrate, thereby providing an improved reliability of the electrical connection between the bumps and the wiring patterns.

The adhesive layer preferably consists of an anisotropic conductive resin sheet to enable the adhesive layer to be formed simply by applying a tape form anisotropic conductive resin sheet to the wiring substrate, thereby significantly improving the production efficiency.

The stud bumps are formed by wire bonding and advantageously simplify the process steps and thereby reduce the production cost, particularly in comparison with the plated bumps requiring the UBM step and the plating step.

What is claimed is:

1. A semiconductor chip package structure in which a semiconductor chip is mounted on a wiring substrate by flip chip bonding to a wiring pattern on the wiring substrate, comprising:

a large number of electrode terminals disposed on an electrode arrangement surface of the semiconductor chip;

a first group of the electrode terminals electrically connected to the wiring pattern by an adhesive layer; and a second group of the electrode terminals electrically connected to the wiring pattern by an elastomer layer.

2. A semiconductor chip package structure according to claim 1, wherein the electrode arrangement surface of the semiconductor chip consists of a peripheral area and a core area surrounded by the peripheral area, the electrode terminals of the first group being disposed in the peripheral area and the electrode terminals of the second group being disposed in the core area.

3. A semiconductor chip package structure according to claim 1, wherein the electrode arrangement surface of the semiconductor chip consists of a peripheral area and a core area surrounded by the peripheral area, the electrode terminals of the first group being disposed in the core area and the electrode terminals of the second group being disposed in the peripheral area.

4. A semiconductor chip package structure according to claim 1, wherein the electrode arrangement surface of the semiconductor chip consists of a pair of opposite side zones and a center zone intervening between the side zones, the electrode terminals of the first group being disposed in the side zones and the electrode terminals of the second group being disposed in the center zone.

5. A semiconductor chip package structure according to claim 1, wherein the electrode arrangement surface of the semiconductor chip consists of a pair of opposite side zones and a center zone intervening between the side zones, the electrode terminals of the second group being disposed in the side zones and the electrode terminals of the first group being disposed in the center zone.

6. A semiconductor chip package structure according to claim 1, wherein the adhesive layer is formed by application of an anisotropic conductive adhesive or an isotropic conductive resin sheet.

7. A semiconductor chip package structure according to claim 1, wherein the adhesive layer consists of an insulating resin.

8. A semiconductor chip package structure according to claim 1, wherein the elastomer layer consists of an adhesive insulating resin.

9. A semiconductor chip package structure according to claim 1, wherein the elastomer layer is formed by application of an adhesive anisotropic conductive resin or an anisotropic conductive resin sheet.

10. A semiconductor chip package structure according to claims 1, wherein the semiconductor chip is mounted on one surface the wiring substrate by being flip chip bonded to the wiring pattern formed on the one surface and external connector terminals are formed on the other surface of the wiring substrate and electrically connected to the wiring pattern.

* * * * *